United States Patent [19]

Dattorro et al.

[11] Patent Number: 5,027,306
[45] Date of Patent: Jun. 25, 1991

[54] DECIMATION FILTER AS FOR A SIGMA-DELTA ANALOG-TO-DIGITAL CONVERTER

[76] Inventors: Jon C. Dattorro, 2 Beaumont La., Devon, Pa. 19333; Albert J. Charpentier, 25 Cool Valley Rd., Malvern, Pa. 19355; David C. Andreas, 1407 Henry Dr., Downingtown, Pa. 19335

[21] Appl. No.: 351,449
[22] Filed: May 12, 1989
[51] Int. Cl.⁵ ............................................. G06F 15/31
[52] U.S. Cl. ................................................. 364/724.10
[58] Field of Search ...................... 364/724.10, 724.01; 341/144

[56] References Cited

U.S. PATENT DOCUMENTS

| 4,323,980 | 4/1982 | Houdard et al. | 364/724.10 |
| 4,811,262 | 3/1989 | White | 364/724.01 |
| 4,866,648 | 9/1989 | Usui | 364/724.01 |

OTHER PUBLICATIONS

Hauser et al, Feb. 13, 1989, MOS ADC-Filter Combination That Does Not Require Precision Analog Components.
Hauser and Brodersen, 1988, Monolithic Decimation Filtering for Custom Delta-Sigma A/D Converters.
He et al, 1988, Multi-Loop Sigma-Delta Quantization: Spectral Analysis.
Ardalan, 1988, Analysis of Delta-Sigma Modulators with Bandlimited Gaussian Inputs.
Naus and Dijkmans, Mar. 1988, Low Signal-Level Distortion in Sigma-Delta Modulators.
Motorola Inc., 1989, DSP56ADC16 16-Bit Sigma-Delta Analog-to-Digital Converter.
Crystal Semiconductor Corporation, Oct. 1988, CS5326 16-Bit Stereo A/D Converter for Digital Audio.
E. Stikvoort, Mar. 1988, Higher Order One Bit Coder for Audio Applications.
Jon Dattorro, 1988, The Implementation of Recursive Digital Filters for High-Fidelity Audio.
Welland et al., Nov. 1988, A Stereo 16-Bit Delta-Sigma A/D Converter for Digital Audio.
Crochiere and Rabiner, Multirate Digital Signal Processing.
Darling and Hawksford, Nov. 1988, Oversampled Analogue to Digital Conversion for Digital Audio Systems.
Spang, III and Schultheiss, Dec. 1962, Reduction of Quantizing Noise by Use of Feedback.
Uchimura et al, 1988, Oversampling A-to-D and D-to-A Converters with Multi-Stage Noise Shaping Modulators.
Robert W. Adams, Mar. 1985, Design and Implementation of an Audio 18 Bit Analog-to-Digital Converter Using Oversampling Techniques.
Boser and Wooley, 1988, The Design of Sigma-Delta Modulation Analog-to-Digital Converters.

*Primary Examiner*—Dale M. Shaw
*Assistant Examiner*—Long T. Nguyen
*Attorney, Agent, or Firm*—Ratner & Prestia

[57] ABSTRACT

A single stage multi-rate finite impulse response filter is used as the decimating filter for a sigma-delta analog-to-digital converter. The filter uses 2048 22-bit coefficient values to produce a sampled data output signal having a sampling rate of 48 KHz and a sample resolution of 16 bits from an input signal having a sampling rate of 3.072 MHz and a sample resolution of one bit. The filter uses a single read-only memory to hold the 2048 coefficient values. The coefficient values are distributed to eight four-way multiplexed accumulators by a circuitry which includes a signal multiplexer and a barrel shifter. The accumulators use unsigned arithmetic to calculate the output sample values. A value C0, representing a normalizing offset and gain applied to each of the coefficient values, is selected such that 2048 times C0 is a value which overflows the accumulator, leaving a value of zero in the accumulator.

7 Claims, 12 Drawing Sheets

DECIMATION FILTER AS FOR A SIGMA-DELTA ANALOG-TO-DIGITAL CONVERTER

Technical Field

The present invention generally relates to digital filters and in particular to a digital decimation filter suitable for use in a sigma-delta analog-to-digital converter.

Background Art

High resolution analog-to-digital converters (ADCs) which support a relatively high sampling rate are now in demand for audio applications. ADC's of this type allow audio signals to be digitized, processed and stored with negligible processing distortion. These stored signals may be retrieved, processed further and then used to reproduce high-fidelity audio signals.

One type of ADC which is especially suited for audio applications is the oversampling ADC. This type of ADC consists of a front end and a decimator. The front end samples and digitizes an analog audio signal at a frequency, F, which is much higher than the audio signal frequencies (typically in the MHz range). These samples are generally of lower resolution than would be desired for the audio application. The decimator combines successive samples to increase the sample resolution and provides these high resolution samples a rate less than the sampling frequency of the front end. The decimator typically includes a digital filter such as a finite impulse response (FIR) filter.

FIG. 1 is a block diagram which illustrates an audio application that uses a particular type of oversampling ADC namely, a sigma-delta ADC. Sigma-delta ADC's are preferred for audio applications because of relaxed constraints on input anti-aliasing filters and because they do not require a sample and hold circuit. In addition, as the level of the signal applied to a sigma-delta ADC decreases, harmonic distortion of the signal produced by the ADC increases slowly. This is primarily due to the linearity of the analog front end. When a front end producing a one-bit digital signal is used, the linearity of a sigma-delta ADC may easily surpass that of an otherwise equivalent successive approximation ADC.

In the sigma-delta process, the quantization noise of a low resolution digital signal is spread over a broad band of frequencies which may span several megahertz. This noise spectrum is shaped via feedback of a filtered digital signal. In shaping the spectrum, quantization noise in the frequency band of interest is reduced at the expense of out-of-band quantization noise. The digital signal having this shaped noise spectrum is then low-pass filtered and decimated to produce a sampled data signal having much greater sample resolution and a lower sampling rate.

In FIG. 1, analog audio input signals are provided by an audio signal source 110 to a sigma-delta ADC 112. The ADC 112 includes a sigma-delta modulator 114 as the front-end and a decimator and low-pass filter 116. In this example, the modulator 114 produces single-bit samples, representing the audio signal, at a relatively high sampling rate. These samples are converted into multi-bit samples at a lower sampling rate by the decimator and filter 116. The sampled data signal generated by the decimator and filter 116 is applied to a digital audio application 118 where it may be processed and stored in digital form.

Sigma-delta ADC's are well known in the art. An exemplary system is described in a paper by D. R. Welland et al. entitled "A Stereo 16-bit Delta-Sigma A/D Converter for Digital Audio", Preprints of the 85th Convention of the Audio Engineering Society, Nov. 1988, Preprint No. 2724, which is hereby incorporated by reference. In the referenced system, a one-bit sampled data signal representing an audio signal is provided by a fourth-order sigma-delta modulator which includes a one-bit flash ADC. This one-bit signal, which has a sampling frequency of 3.072 MHz, is applied to a three-stage decimation filter. The first stage reduces the sampling rate to 384 KHz and the second and third stages further reduce it to 96 KHz and 48 KHz, respectively.

The fast, but low-resolution, front end introduces quantization noise to the signal in inverse proportion to the resolution; high resolution samples have a relatively low noise component. For example, if the front end is a 3-bit converter, then there are $2^3$ or 8 digital signal levels, and the quantization noise in any one sample can be as much as a 1/16th (one-half of ⅛th) of the analog reference voltage range. A 4-bit converter would have a maximum noise of 1/32nd of reference voltage range.

Quantization noise may be modeled as white noise, on the assumption that the instantaneous difference between the relative amplitudes of the analog audio signal and the digitized signal is random. Since the quantization noise is random, its power spectrum spans a relatively broad frequency range.

Aliasing distortion which accompanies sampling occurs when the power spectrum of the quantization noise is folded back on itself. Quantization noise having frequencies greater than F/2 is shifted back into the noise spectrum below the foldover point. Thus samples produced by a fast, low-resolution converter have a relatively high quantization noise component, but that noise is spread out over a wide noise power spectrum based on the selection of the front-end sampling frequency.

When the digital output signal provided by the front end is applied to a low-pass filter, having a cut off frequency greater than the highest audio frequency, the quantization noise power can be greatly reduced. Thus, the samples produced by a fast front end, even if they contain relatively high levels of quantization noise, can be used to produce high resolution samples having relatively low noise levels if the digital signal provided by the front end can be efficiently filtered.

When an audio signal has been digitized at a relatively high sampling frequency and filtered as set forth above, its effective sampling rate may be reduced by decimation. In this process, every nth digital sample is selected and the rest are discarded. The number n is chosen so that the new sampling frequency is at or above the Nyquist rate of the original audio signal. The choice of this rate substantially eliminates aliasing distortion in the output audio signal. In the example set forth above, the decimation process selected one of every 64 samples to produce an output signal having a sampling rate of 48 KHz, twice the highest audio frequency, 24 KHz. Decimation is often done with the same digital low-pass filter that is used to remove out-of-band noise from the signal. Thus, this filter converts the low-resolution, high-speed samples into high-resolution, low-speed samples.

In practice, a limitation on oversampling ADC's is the speed and size of the digital decimation filter. As the oversampling ratio (i.e. n) increases, the desirable number of filter coefficients also increases. So, as the front-end sampling frequency increases, the number of computations for each output sample, and the cost of the hardware to perform the computations also increase. Thus, in practice, there is a trade-off between quantization noise reduction and filter cost. One method which has been used to reduce the cost of the decimation filter is to use two or more decimation filters in series. Each of these filters has fewer coefficients than a single decimation filter. Consequently, a multi-stage decimation filter may use less expensive circuitry to perform its computations than an otherwise equivalent single stage filter.

However, multi-stage filters may introduce more noise into the audio frequency band than a single stage filter. This occurs because each stage of the filter reduces the sampling rate of the signal being processed. Thus, for each stage of the filter, a portion of the noise power spectrum is folded back into the baseband audio spectrum. Since each of these component filters is less complex and thus less efficient than a single stage filter at reducing the level of out-of-band noise, a significantly greater amount of folded-back out-of-band noise may be added to the baseband spectrum by a multi-stage decimation filter than would be added by an otherwise equivalent single stage filter.

Disclosure of the Invention

The present invention is embodied in a single-stage sampled data filter which may be used, for example, in a sigma-delta analog-to-digital converter. This filter low-pass filters a sampled data input signal. The filter includes a memory which holds a plurality of coefficient values. Coefficient distributing apparatus is coupled to the memory to distribute the coefficient values to a plurality of input signal processing elements in response to a control signal. The signal processing elements combine the input signal with the coefficient values to produce a filtered output signal. The control signal changes the distribution of coefficient values for each sample of the input signal.

Detailed Description of the Invention

Figure 2:
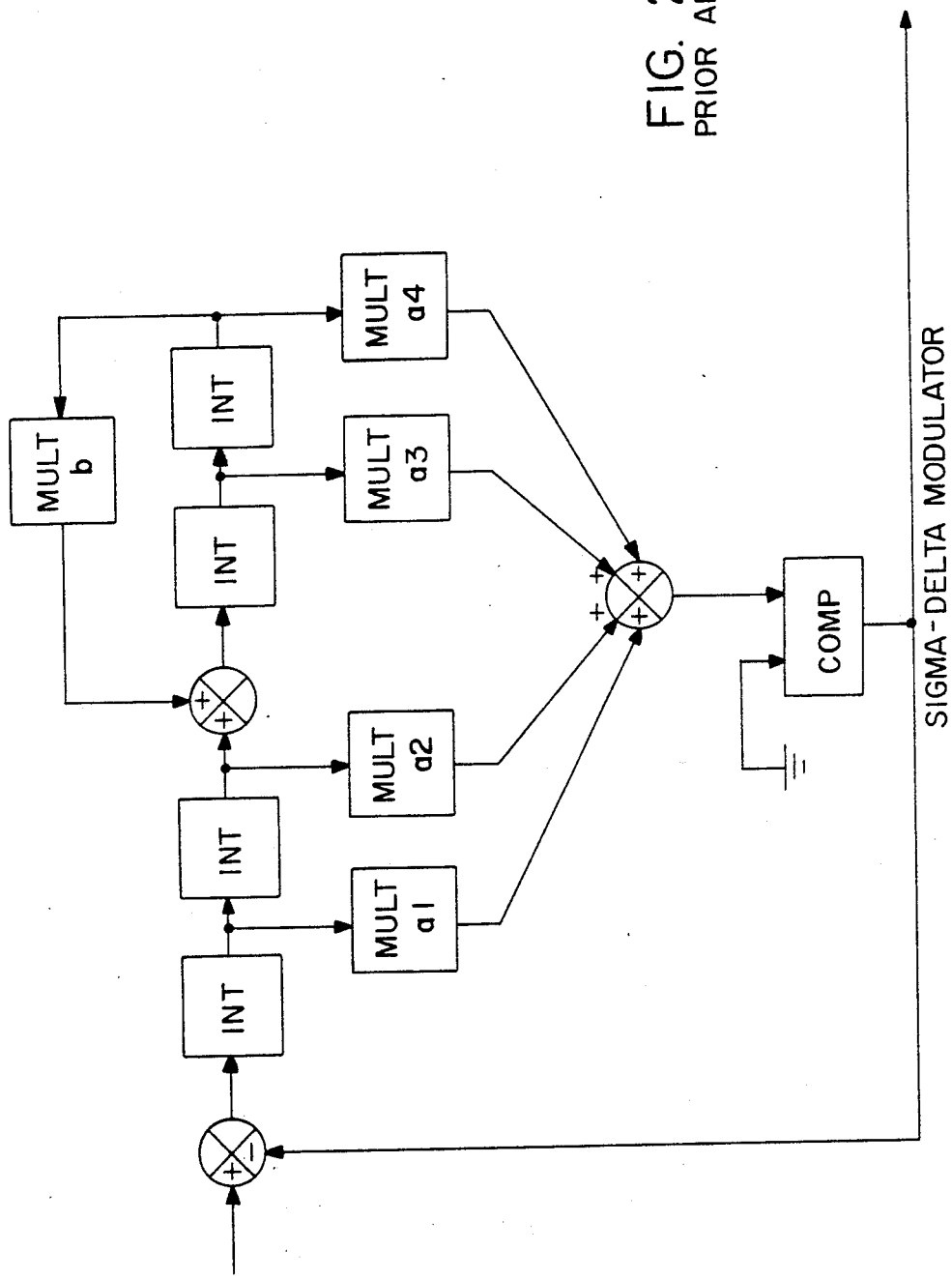
FIG. 2 (prior art) is a block diagram of a sigma-delta modulator suitable for use in the sigma-delta analog-to-digital converter shown in FIG. 1.

The sigma-delta analog-to-digital converters described below use a fourth-order sigma-delta modulator, which does not need a sample-hold circuit, has low harmonic distortion and has good linearity characteristics. This modulator, which is shown in FIG. 2, produces a one-bit data stream. The modulator operates with a sampling rate of 3.072 MHz to digitize an audio signal having a Nyquist rate of 48 KHz. Thus, the oversampling ratio is 64:1. This modulator is the same as the one described in the above-referenced article by D. R. Welland et al. A single stage FIR decimation filter, having 2048 coefficients, low-pass filters and decimates the signal provided by the modulator to produce a digital output signal having a sampling rate of 48 KHz and having equivalent resolution to a sampled data signal provided by a 16-bit flash ADC.

To decimate using a single canonical form FIR digital filter is beyond the ability of present technology. As set forth below, in order to achieve the desired signal noise attenuation, a filter having 2048 22-bit coefficients is desirable. The 48 KHz output sample rate for the ADC allows only 20.83 microseconds ($\mu$s) to calculate each output sample, where each calculation includes 2048 conditional addition operations. Thus, (20.83/2048) $\mu$s or approximately 10 nanoseconds (ns) are available for each addition. At present, it is beyond the capability of any commercially available logic circuitry to perform a 22-bit addition in 10 ns.

To overcome this limitation, the decimation filter, used in the embodiments of the invention described below, employs 32 digital FIR filters configured in parallel as a single multirate filter. The output signals provided by the 32 filters are staggered in time such that each filter provides sample values at a rate of 48 KHz/32 or 1.5 KHz. These output sample values are combined by commutation to produce an output signal having a sampling frequency of 48 KHz.

Although aliasing distortion of the audio signal is introduced by the low 1.5 KHz rate of each of the component FIR filters, this aliasing distortion is canceled when the 32 outputs, each having a phase shift of 360 degrees/32 relative to its neighbor, are combined. For example, if an analog audio-frequency sine wave of 1.5 KHz were applied to the front end, each of the 32 FIR filters would produce a constant-value output signal (as if that filter were acting on a DC signal). But the sequence of staggered outputs from the 32 filters in sequence would combine the different constant-value samples to recreate the original 1.5-KHz sine wave.

Using this parallel filter structure, 355 ns are allowed for each conditional addition operation. Furthermore, in the embodiments described below, both the input signal and the coefficient values are normalized to be greater than zero. This allows relatively simple and fast circuitry to be used to perform the addition operations, since negative numbers do not have to be considered. In the second and third embodiments of the invention described below, the 2048 coefficients are shared by all of the 32 FIR filters. The third embodiment of the invention includes an barrel shifter which efficiently distributes the coefficients among the 32 filters. In addition, the third embodiment of the invention uses time-division multiplexed accumulators to further reduce the size of the decimation filter.

Figure 3A:
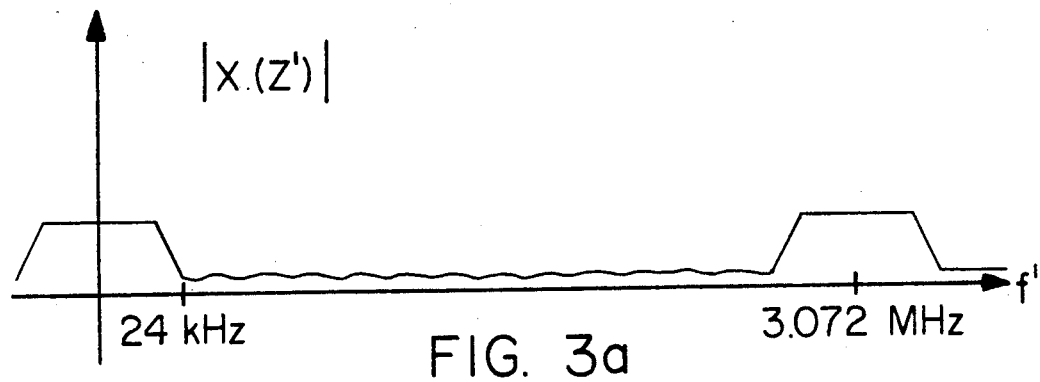
FIGS. 3a through 3c are graphs of signal amplitude versus frequency which are useful for describing the signal noise characteristics of a sigma-delta analog-to-digital converter.
Figure 3B:
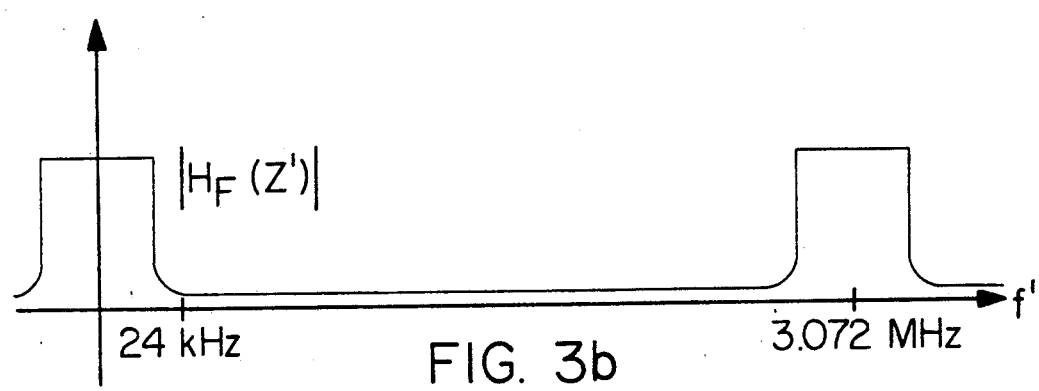
Figure 3C:
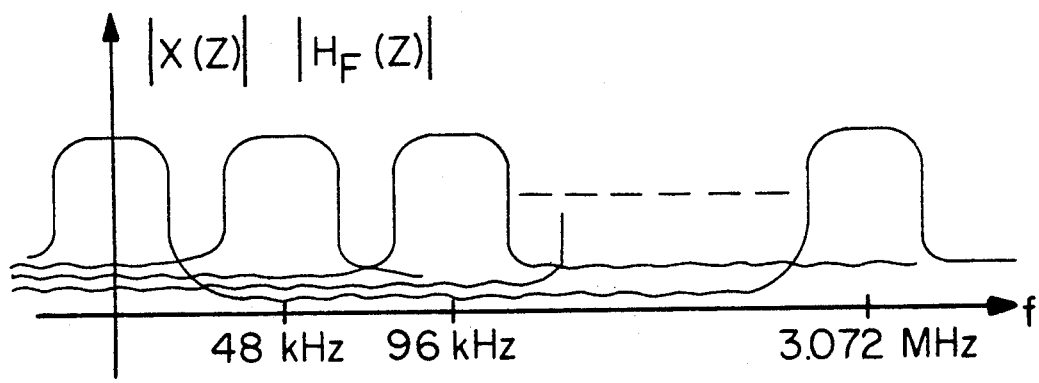
Figure 4:
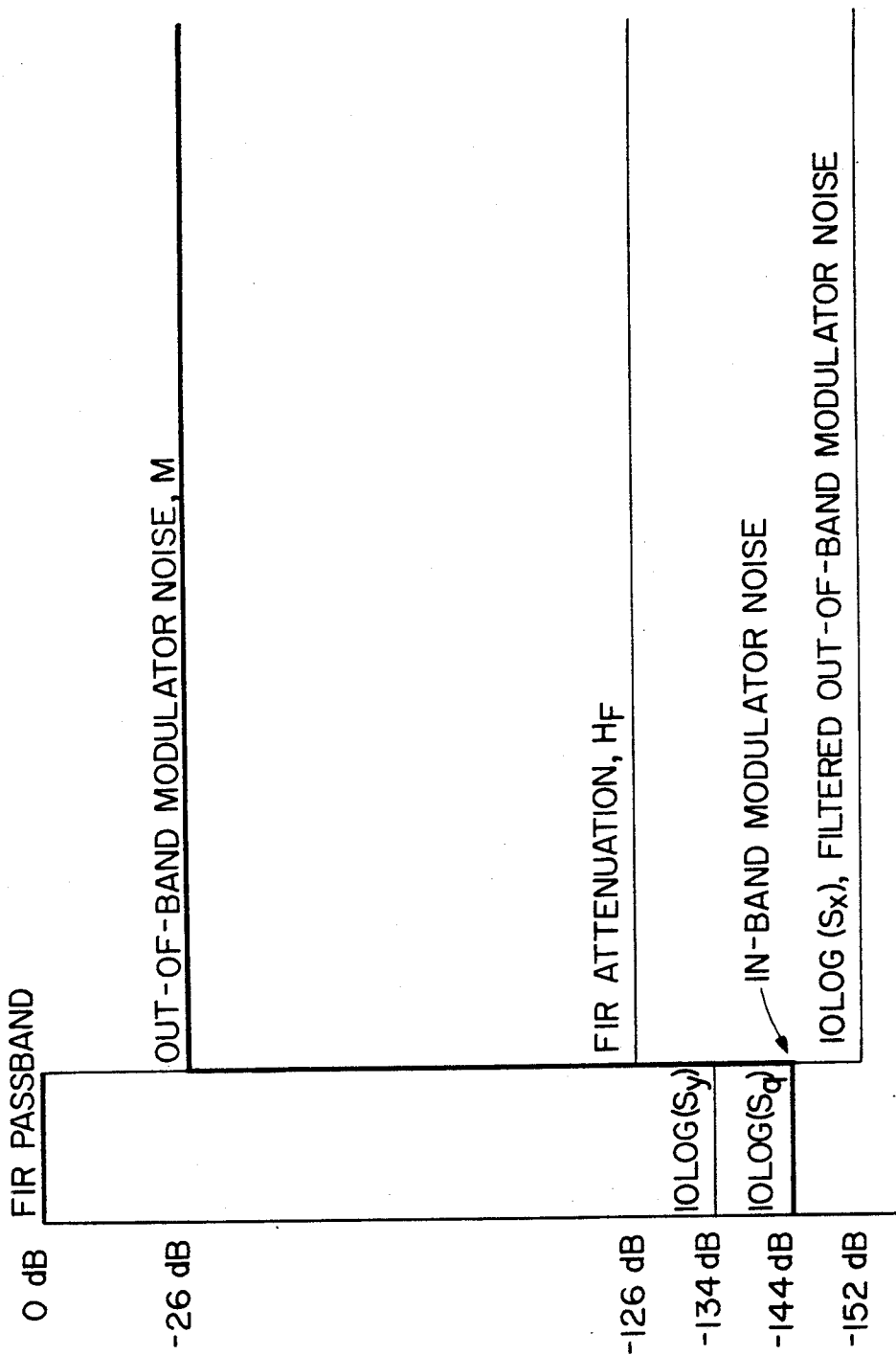
FIG. 4 is a graph of signal amplitude versus frequency which is useful for explaining the desired precision of the decimation filter of a sigma-delta analog-to-digital converter.
Figure 5:
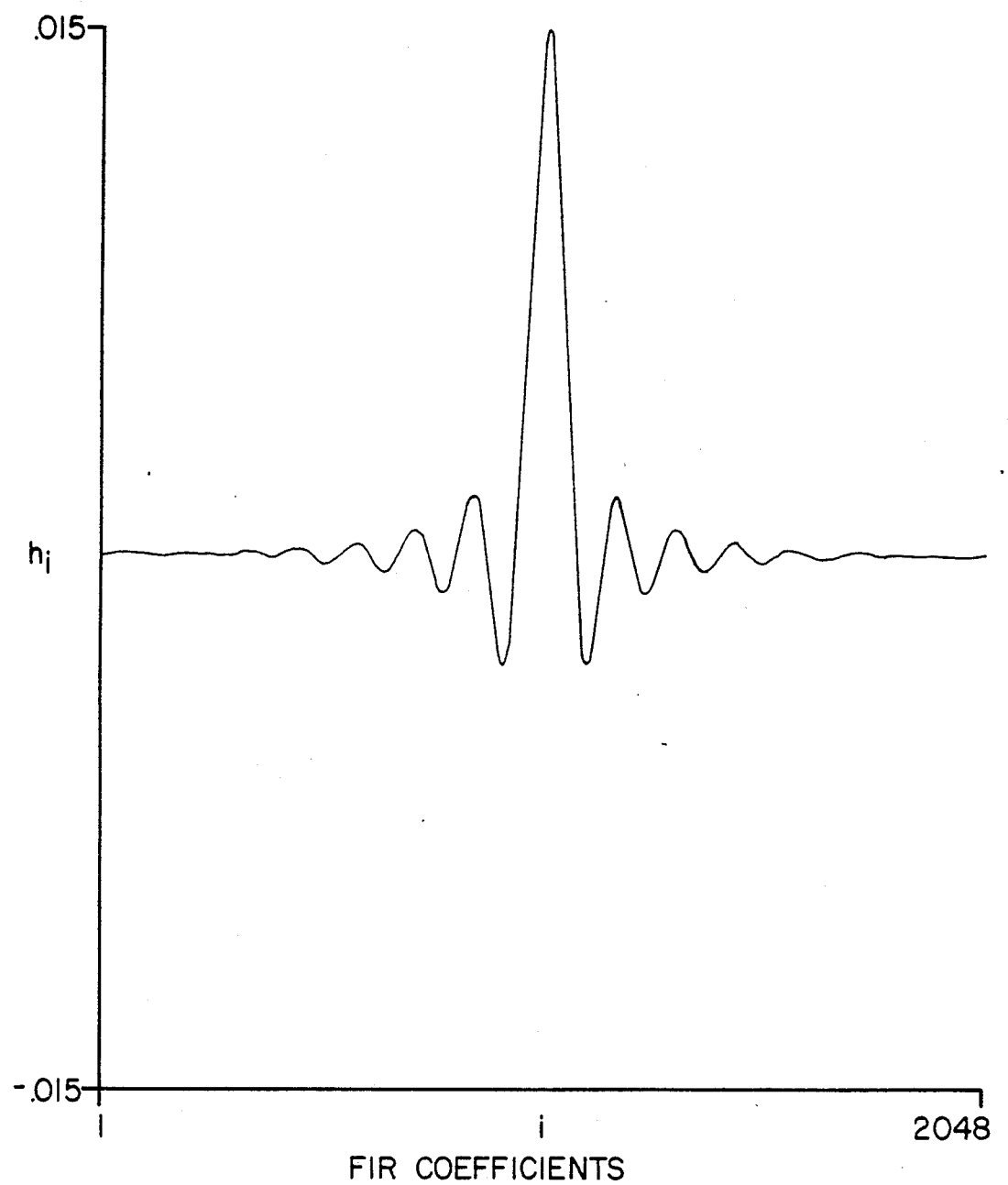
FIG. 5 is a graphical depiction of coefficient values suitable for use in a decimation filter which includes an embodiment of the present invention.

The following discussion, with reference to FIGS. 3 through 5, is a brief explanation of some of the mathematics underlying the design of the decimation filters described below. This is followed by descriptions of three exemplary filters with reference to FIGS. 6 through 12.

FIGS. 3a through 3c show the process of decimation in the frequency domain. FIG. 3a shows the baseband audio spectrum of an exemplary one-bit sampled data signal which may be produced, for example, by the sigma-delta modulator shown in FIG. 2. This frequency spectrum is shown out to 3.072 MHz with its first replication. FIG. 3b shows the original spectrum multiplied by FIR transfer function of an FIR low-pass filter. It is noted that, while the stopband attenuation of the FIR filter is significant, it does not reduce the amplitude of signals in the stopband to zero.

When the signal shown in FIG. 3b is decimated, the original 3.072 MHz frequency spectrum is replicated at every multiple of the decimation frequency (48 KHz). Each of these replications, shown in FIG. 18(c), has a long "tail" of noise (which represents the FIR filtered out-of-band signal prior to decimation). These tails add at any one place along the spectrum line, including the audio pass-band of the decimation filter. Because there are a total 63 new replications, the noise in the baseband spectrum may be as much as times the original noise.

The sigma-delta front end is so designed that the noise from the replicated spectra is uncorrelated; consequently, the additive noise in the baseband signal caused by the tails of the various replications does not reach unmanageable levels.

As shown in FIG. 4, the noise in the passband of the FIR filter, $S_y$, is the sum of 63 times $S_x$, the out-of-band noise for the 63 replications of the frequency spectrum, and $S_q$, the audio baseband predecimation noise power spectral density (i.e. the inband quantization noise of the signal produced by the sigma-delta modulator). The out-of band modulator noise is represented by M in decibels (dB). The decimation filter used in this embodiment of the invention should, desirably, reduce the out of band noise power sufficiently to keep the sum of $S_q$ and 63 $S_x$ at least 90 dB below signal power in the 24 KHz baseband. This matches the performance of a 16-bit flash ADC.

The total noise power in the baseband signal is the power-spectrum integral over the passband (taken as 0 to 24 KHz) of the noise. Since the noise power spectrum is essentially flat, the integral reduces to a multiplication of the average noise level in the passband times 24 KHz. Thus, $-90$ dB$=10 \log [24$ KHz$\times S_y]$, which means that $S_y$ is $10^{-134/10}$ and that $10 \log (S_y)$ is $-134$ dB.

To achieve this power level for the noise signal $S_y$, the stop-band attenuation of the FIR decimator should be at least $-126$ dB. An attenuation of $-126$ dB of attenuation may be achieved if the coefficients of the FIR filter have at least 21 bits of resolution (assuming a noise reduction of 6 dB per bit). This can be understood intuitively by thinking of the FIR coefficients as quantized samples, representing the impulse response of the low-pass filter, which are used to multiply the input samples during the filtering process. If the combined quantization noise floor of these samples exceeds the desired stopband level, the filter clearly will not perform well. In a practical implementation, as much as 4.4 dB of attenuation can be lost from the theoretical limit, consequently, the filter coefficients used in these embodiments of the invention have 22-bits of resolution. However, satisfactory results may be obtained when 21-bit coefficient values are used.

The present invention uses 2048 coefficients in the FIR decimator. These coefficients are graphically shown in FIG. 5. These coefficients range in value between $-0.00312$ and $+0.0148$. The particular FIR coefficients shown in FIG. 5 produce a passband gain of unity and greater than $-126$ dB attenuation above the passband. The transition band of the filter exhibits a drop-off of approximately 392 dB per octave.

The circuitry used to implement the filter may be simplified if the coefficient values are normalized such that all coefficient values are positive. This may be accomplished by adding an offset value, d, to each coefficient value. In this embodiment of the invention, the offset value d is greater than or equal to the absolute value of the most negative coefficient value. The exact value selected for d depends on other constant values used in the system as set forth below. Using normalized coefficient values simplifies the filter circuitry since it allows the accumulator bits above bit 22 to be implemented as half-adder circuits instead of full-adder circuits.

The precision of the filter may be increased by eliminating leading binary zeroes from these normalized coefficient values. This makes room for extra trailing bits, and hence a greater total number of significant bits in each coefficient. If each of the coefficient values is represented by a 22-bit binary value, the greatest precision will result when the coefficient values are normalized such that the largest normalized coefficient has a value of one. This may be achieved by increasing the range of the coefficient values from 0.018 to about one. By this operation, the magnitude of each coefficient is increased by a factor of $1/0.018 = 55.7$.

This increase in the magnitudes of the coefficients has the beneficial side effect of introducing a signal amplification factor or gain, g, to the signal provided by the ADC. In this instance, g has a maximum value of 55.7. As set forth below, g has a value of 32 in these embodiments of the invention.

The kth normalized coefficient, $h_{norm}(k)$, is now determined from the original coefficient h(k) by the formula shown in equation (1).

$$h_{norm}(k) = [h(k)+d]g = gh(k)+dg \quad (1)$$

In equation (1), k may have values from 0 to 2047 and $h_{norm}(k)$ may occupy a range of values between zero and one.

The filtering operation performed by the FIR decimation filter may be represented as a standard convolution of the signal x(n) provided by the sigma-delta modulator with the impulse response of the FIR filter. Mathematically, this is represented by equation (2).

$$y(n) = \sum_{k=0}^{2047} h(k) x(n - k). \quad (2)$$

Since the coefficient values actually used are normalized, this expression is not realized directly. The modified expression is shown in equation (3).

$$y(n) = \sum_{k=0}^{2047} h_{norm}(k) x_{norm}(n - k) \quad (3)$$

In equation 3, $x_{norm}(n) = x(n) + 0.5$, so that $x_{norm}(n)$ is either 0 or 1 ($x(n)$ is either $-0.5$ or $+0.5$).

Because this new sum y(n) incorporates the offset and gain values, d and g, it is desirably adjusted back to the standard convolution sum times the gain factor g. This adjustment takes two factors into account. First, each value of the signal $x_{norm}(n)$ has been increased by 0.5 as set forth above. This changes the average value of the signal provided by the sigma-delta modulator from 0 to 0.5. This non-zero average value for the signal $x_{norm}$ introduces an offset into the summation of the convolution performed by the FIR filter. The value of this offset depends on the gain factor g of the coefficient values. A sequence of zero values for the signal $x_{norm}(n)$ would produce a zero valued output signal from the filter, while a sequence of one values would produce an output signal having a value of g. Thus, the average offset is g/2. To eliminate this DC component, the output signal provided by the FIR filter is desirably reduced by g/2. This neutralizes the nonzero offset of the samples $x_{norm}(n)$. Equation (4) represents the output signal of the decimation filter.

$$y(n) = \sum_{k=0}^{2047} h_{norm}(k) x_{norm}(n - k) - g/2 \quad (4)$$

A second correction of the output signal y(n) is desirable because each coefficient value, $h_{norm}(k)$, in equation (4) includes an additive term dg. Since this term appears in each coefficient value, in one convolution or cycle of the filter, the dg term is added to y(n) as much as 2048 times as k is incremented from 0 to 2048 and $x_{norm}(n-k)$ takes on the values 0 and 1. The embodiments of the invention set forth below compensate for this accumulation of the dg terms by the following method.

A constant, C0, is introduced into the computation of y(n) as indicated by the equation (5).

$$y(n) = \quad (5)$$

$$\sum_{k=0}^{2047} \{h_{norm}(k) x_{norm}(n - k) + C0[1 - x_{norm}(n - k)]\} - g/2$$

If $x_{norm}(n-k)$ is 1, then $[1-x_{norm}(n-k)]$ is 0 and vice-versa. Consequently, if C0 is set equal to dg, then the accumulation of both the dg terms and the C0 terms for any single convolution is exactly 2048dg = 2048C0.

The value of the factor C0 is selected so that 2048 times C0 will exceed the available dynamic range of the filter's accumulator, leaving a zero value in the accumulator. That is to say, if, as in the present embodiments of the invention, the filter produces 27-bit sample values for the signal y(n), the factor C0 may be selected such that 2048 times C0 is a value represented by a binary one followed by 27 less significant binary zeros. This value is equivalent to zero since, as set forth above, the values accumulated in the filter are unsigned binary numbers. The exact value represented by C0 will depend on the positioning of the radix point in the sample values produced by the filter.

Figure 1:
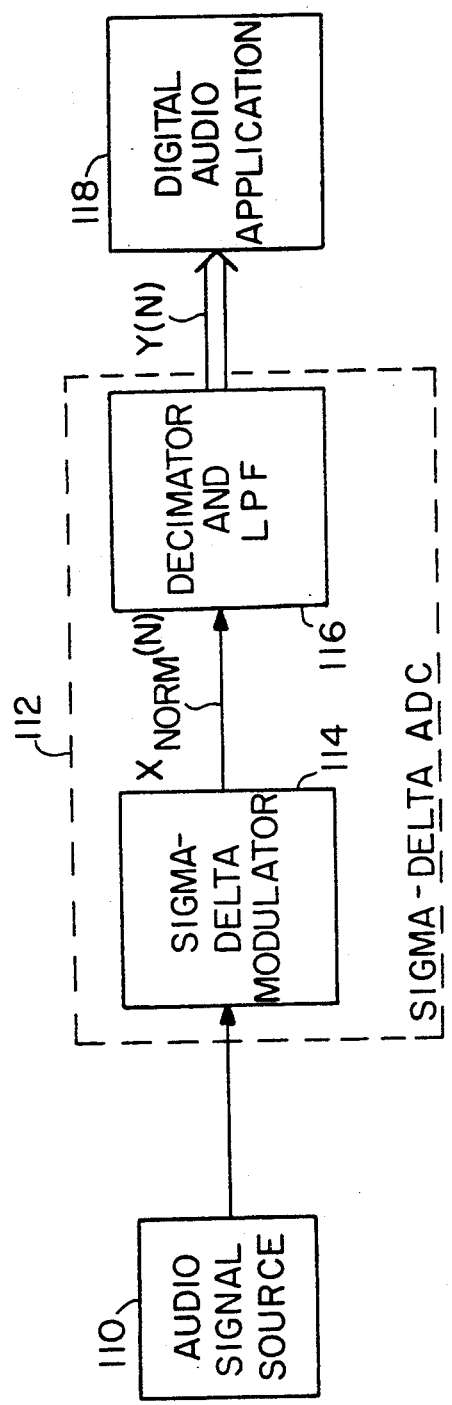
FIG. 1 (prior art) is a block diagram which was used above to illustrate the configuration of a typical digital application which employs a sigma-delta analog-to-digital converter.
Figure 6:
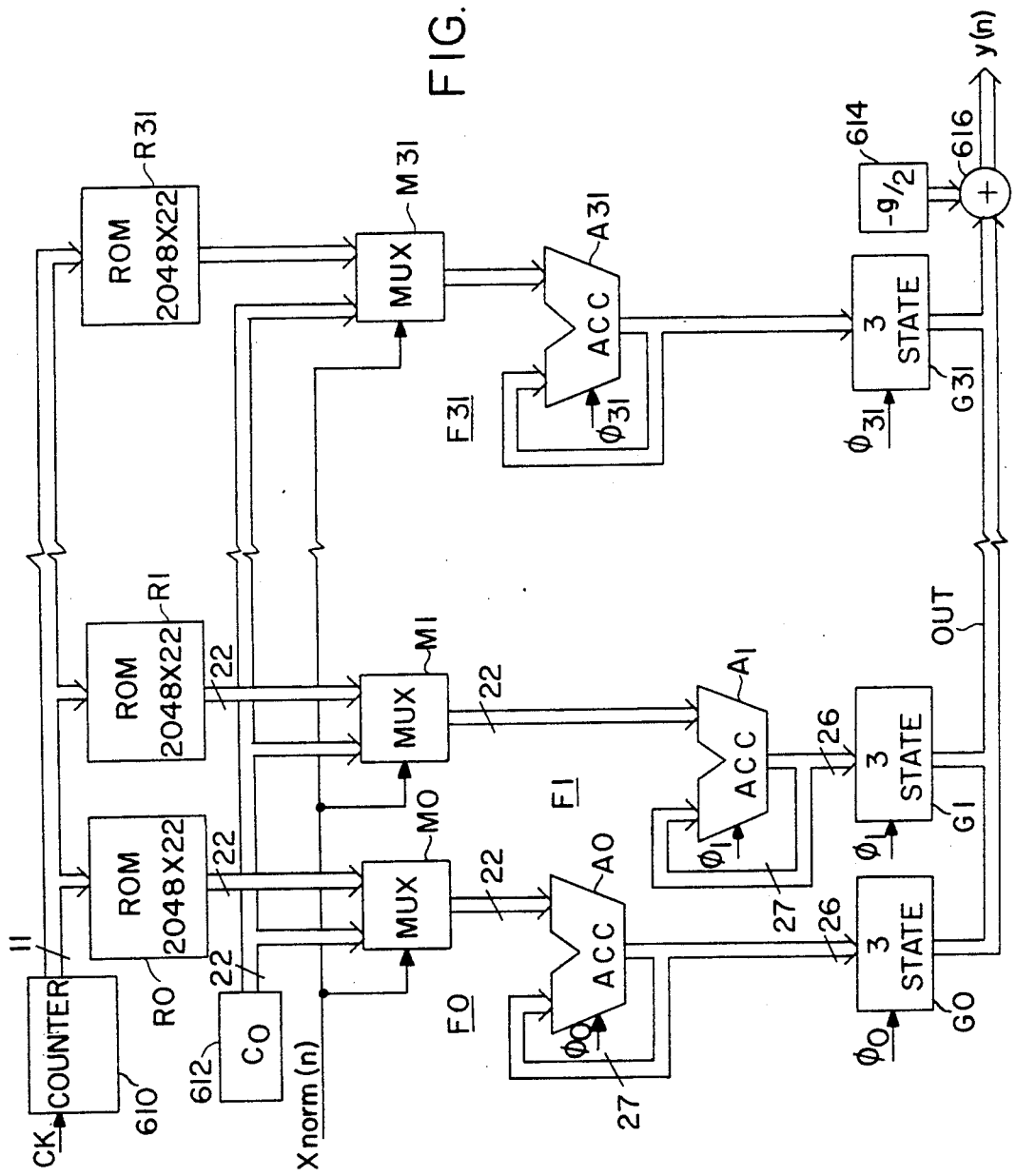
FIG. 6 is a block diagram of a first embodiment of a decimation filter in accordance with the present invention.

One implementation of a decimation filter consistent with equation (5) is shown in FIG. 6. This filter is described as a replacement for the filter 116 shown in FIG. 1. The filter in FIG. 6 includes 32 FIR filters configured in parallel as a single multirate filter. For the sake of brevity, only three of these filters, F0, F1 and F31 are shown. In the embodiment shown in FIG. 6, coefficients for the 32 FIR filters are provided by 32 respective 2048 by 22-bit read-only memories (ROMs), R0 through R31. Each ROM holds all of the 2048 filter coefficient values but the addresses of equivalent coefficient values in successive ROMs are offset by 64. That is to say, ROM R0 holds the 2048 coefficient values at addresses 0 to 2047 in order from h(0) to h(2047), ROM R1 holds the coefficient values in order from h(1985) to h(2047) followed by h(0) to h(1984). ROM R31 holds the coefficient values in order from h(64) to h(2047) followed by h(0) to h(63). All of the ROMs R0 through R31 are responsive to an 11-bit address signal provided by a counter 610 in response to a clock signal, CK, having a frequency substantially equal to 3.072 MHz. The signal CK is the sampling clock signal of the sigma-delta modulator 114 which provides samples to the decimation filter shown in FIG. 6. This clock signal may be externally supplied or it may be generated, for example, by a crystal controlled oscillator (not shown).

In response to the address signal provided by the counter 610, each of the ROMs R0 through R31 provides coefficient values to first input ports of respective multiplexers M0 through M31. The second input ports of these multiplexers are coupled to receive a digital value C0 provided by a digital value source 612. The multiplexers M0 through M31 are controlled by a signal $x_{norm}(n)$, the one-bit output signal provided by the sigma-delta modulator 114. When the signal $x_{norm}(n)$ has a value of 1, the multiplexers M0 through M31 are conditioned to pass the coefficient values currently provided by the respective ROMs, R0 through R31. When the signal $x_{norm}(n)$ has a value of 0, the multiplexers are conditioned to pass the digital constant value C0.

The 22-bit values provided by the multiplexers M0 through M31 are accumulated over a convolution by respective accumulators A0 through A31. Each of these accumulators includes a 27-bit adder (not shown) and a 27-bit accumulator register (not shown). Each accumulator A0 through A31 is responsive to a respectively different control signal $\phi_0$ through $\phi_{31}$ to reset the value held in its accumulator register to zero coincident with the negative-going edge of the control signal. The signals $\phi_1$ through $\phi_{31}$ are repetitive pulse signals, where each pulse has a pulse width substantially equal to one-half of one period of the signal CK. The signals $\phi_1$ through $\phi_{31}$ have substantially the same frequency, 1.5 KHz, and have 32 respectively different phases. If all of the control signals $\phi_1$ through $\phi_{31}$ were added together, a clock signal having a frequency of 48 KHz would be obtained.

The sampled data signals provided by the accumulators A0 through A31 are applied to respective three-state gate circuits G0 through G31. Each of these gate circuits is responsive to a respectively different one of the control signals $\phi_1$ through $\phi_{31}$ to gate the value applied to its input port onto a common bus, OUT. In this configuration, the output values provided by each of the accumulators A0 through A31 is gated onto the bus in sequence to generate a sampled data signal having a sampling frequency of 48 KHz. Immediately after each value is gated onto the bus, the value in the accumulator register is reset to zero.

A subtracter 616 is coupled to subtract a digital value g/2, from each sample of the signal provided by the bus OUT. The subtracter 616 may, for example, concatenate a binary zero in the most significant bit (MSB) position of each 26-bit value provided by the bus OUT and add, to each value, a 27-bit twos complement value representing $-g/2$. The output signal, $y(n)$, of the subtracter 616 is the output signal of the decimation filter.

Figure 7:
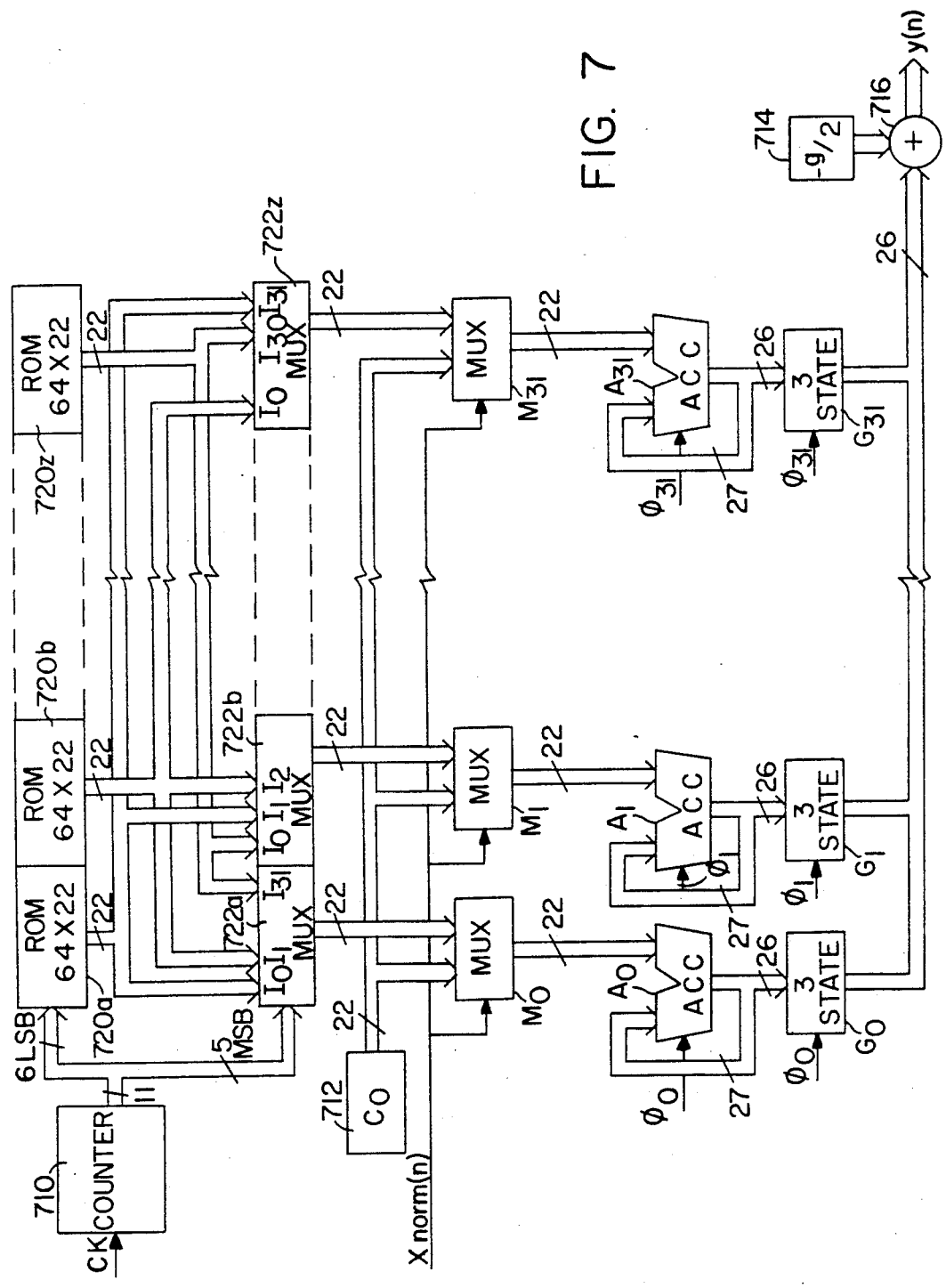
FIG. 7 is a block diagram of a second embodiment of a decimation filter in accordance with the present invention.

The filter described in reference to FIG. 6 uses 1.4 M bits of read-only storage to hold the 2047 coefficients for the 32 parallel FIR filters. FIG. 7 shows a first alternative embodiment of the decimation filter which uses only 45 K bits of read-only storage. In this embodiment, a single 2048 by 22-bit ROM 720 is shared by all of the filters. This sharing is accomplished by partitioning the ROM into 32 parts, each containing 64 coefficient values. The coefficient values are allocated among the partitions in groups of 64. The first partition, 720a, includes the coefficient values $h_{norm}(0)$ to $h_{norm}(63)$ the second partition includes the coefficient values $h_{norm}(64)$ to $h_{norm}(127)$ and so on. The last partition, 720z, includes the coefficient values $h_{norm}(1984)$ to $h_{norm}(2047)$. All of the partitions have a common address input port and each partition has, a separate output port. The address input signal for the ROM 220 is the six least significant bits (LSB's) of an 11-bit signal provided by a counter 710.

The 5 MSB's of the signal provided by the counter 710 are applied to a common control input port of a set 722 of 32 multiplexers. Each of the multiplexers 722a through 722z has 32 data input ports, I0 through I31, and one output port. Each multiplexer 722a through 722z is conditioned by the control signal provided by the counter 710 to selectively couple one of its input ports to its output port. In this embodiment of the invention, the number of the input port which is coupled to the output port at any given time is the value of the five-bit control signal provided by the counter 710.

The output ports of the ROM 720 are connected to the input ports of the multiplexers 722 in a staggered manner. That is to say, the output port of the first partition, 720a, is coupled to the input ports I0, I1 and I31 of the multiplexers 722a, 722b and 722z, respectively. The output port of the second partition 720b is connected to the input ports I2, I3, and I1 of the respective multiplexers 722a, 722b and 722z. The output port of the last partition, 720z, is connected to the input ports I31, I1 and I30 of the respective multiplexers 722a, 722b and 722z.

In this configuration, the multiplexers 722a through 722z direct the coefficient values from the ROM 720 to the respective multiplexers M0 through M31 in the same order as set forth above in reference to FIG. 6. The remainder of the circuitry for the decimating filter shown in FIG. 7 is identical to that described above in reference to FIG. 6 and, so, is not described in detail.

Figures 1, 8:
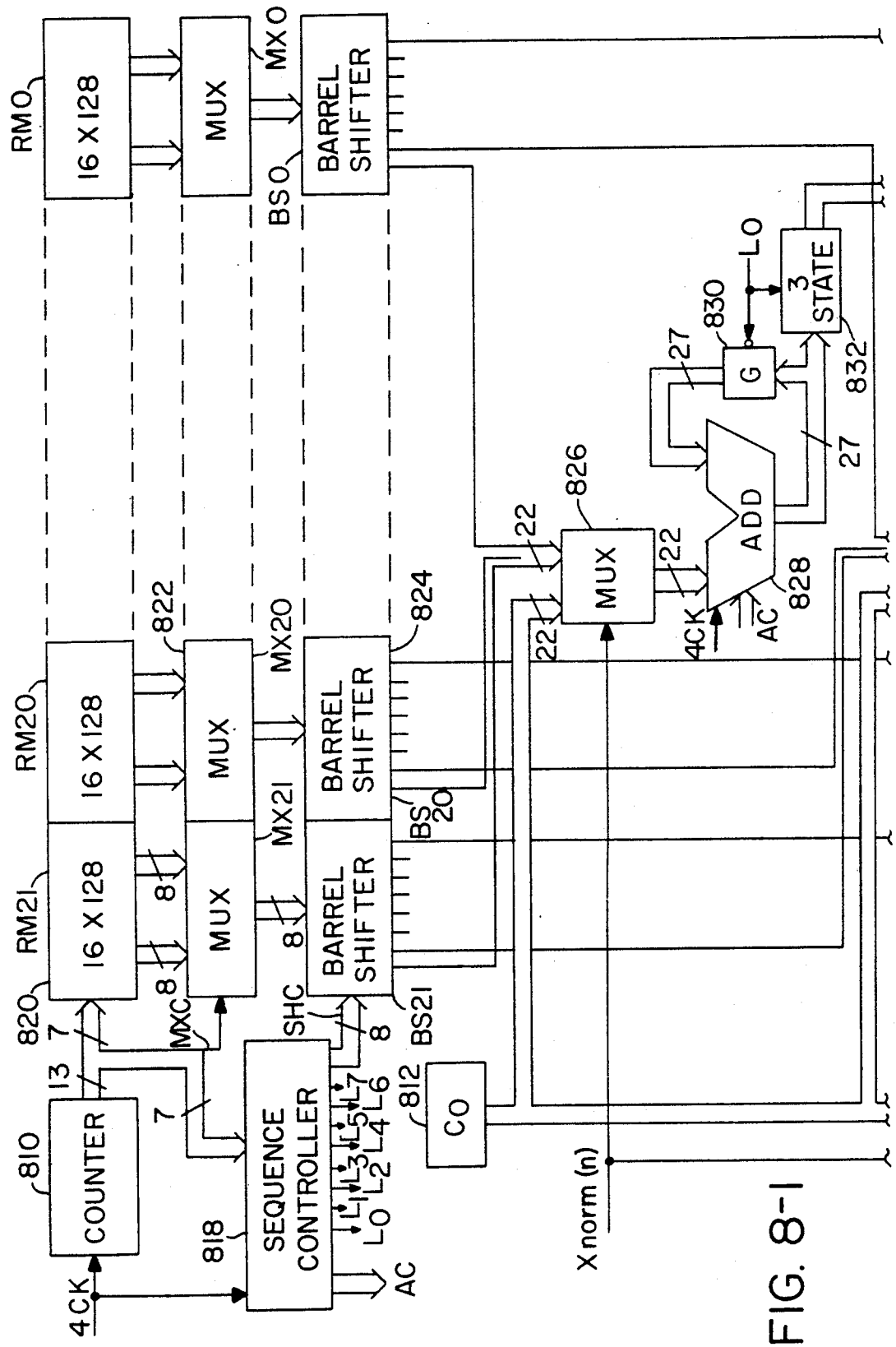
FIG. 8 is a block diagram of a third embodiment of a decimation filter in accordance with the present invention.
Figures 2, 8:
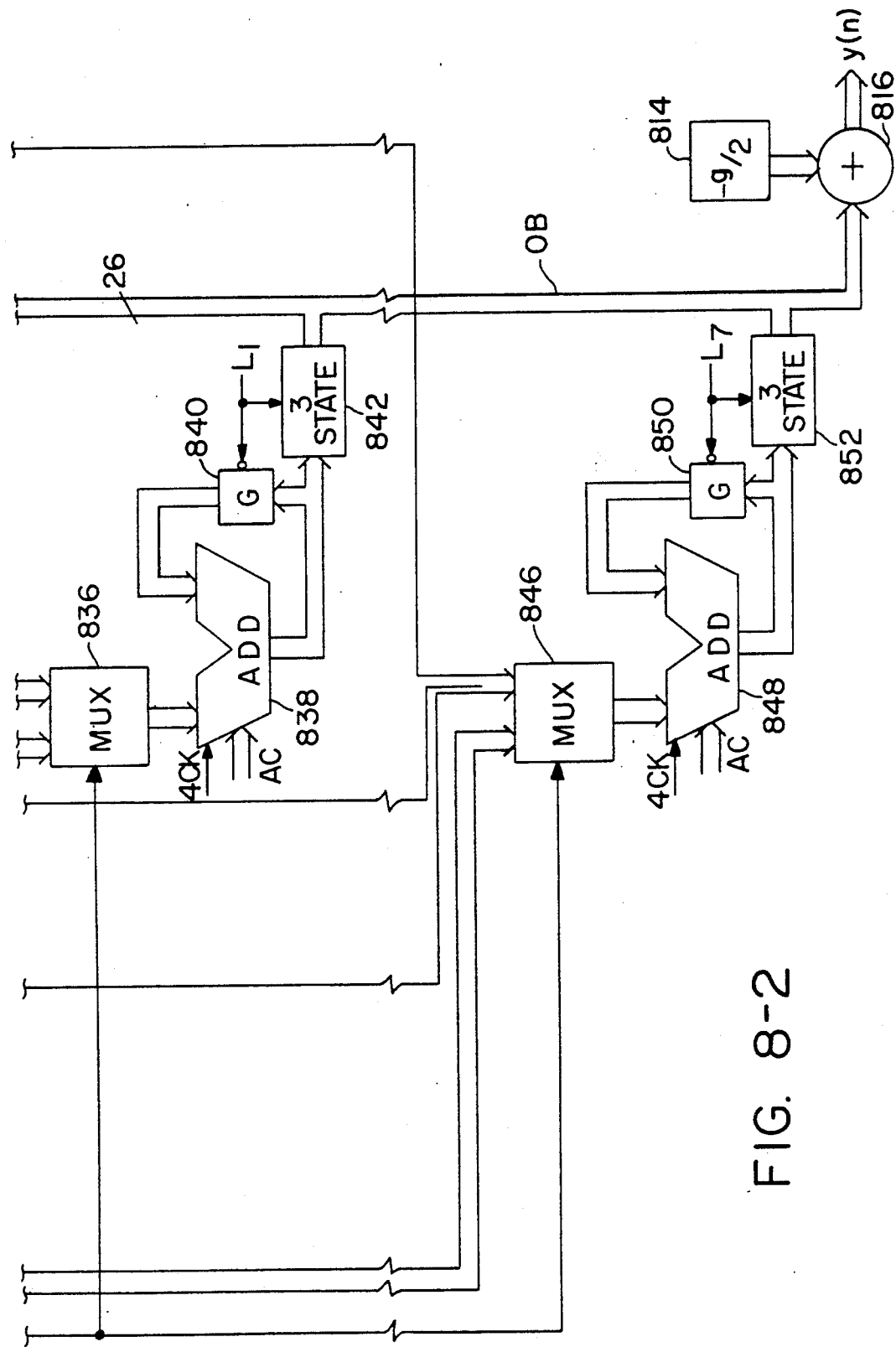

A third alternative embodiment of the decimating filter 116 is shown in FIG. 8. This filter performs the same function as the filters described above in reference to FIGS. 6 and 7 using less circuitry. In addition, the filter shown in FIG. 8 may be more readily realized as an integrated circuit than the filter described in reference to FIG. 7. In the following, the structure of this circuitry is described with reference to FIGS. 8, 9 and 10 and then the operation of the circuitry is described in reference to FIGS. 11 and 12.

The filter shown in FIG. 8 is organized for efficient implementation by a integrated circuit. To this end, all of the components corresponding to a selected bit of a coefficient value are arranged in the FIG. 8 so that they may be positioned in a substantially straight line on the integrated circuit. This design simplifies the layout of the integrated circuit by making its structure regular having many identical components.

The decimating filter shown in FIG. 8 includes a single 2048 by 22-bit ROM 820 which is configured as 22 segments, RM0 through RM21. To simplify the drawing, only three of the segments, RM0, RM20 and RM21 are shown in FIG. 8. Each segment has 128 16-bit values. The 2048 bits in a segment are corresponding bits of the respective 2048 coefficient values. That is to say, segment RM0 holds the LSB's, and segment RM21 holds the MSB's of each of the 2048 coefficient values. The segments RM1-RM20 hold the respective bits 1 to 20 of each of the coefficient values.

The 22 segments of the ROM 820 are configured in parallel, having a common address input port. The address value applied to the ROM 820 is generated by a counter 810 as set forth below in reference to FIGS. 11 and 12. The counter 810 is a 13-bit counter which is clocked by a clock signal, 4CK. This signal has a frequency of 12.288 MHz, four times the frequency of the signal CK described above in reference to FIGS. 6 and 7. The signal 4CK may be provided externally or it may be generated by an internal crystal controlled oscillator (not shown). The address signal applied to the ROM 820 changes at a frequency of 6.144 MHz, one-half the frequency of the signal 4CK.

Each segment of the ROM 820 provides two eight-bit output values to a respectively different one of 22 multiplexers MX0 through MX21 during one memory cycle. Only three of these multiplexers, MX0, MX20 and MS21 are shown in FIG. 8. These multiplexers are collectively labeled with the reference number 822. The multiplexers 822 are configured with a common control input terminal that is coupled to receive a signal MXC, the LSB of the signal provided by counter 810. Each of the multiplexers MX0 through MX21 alternately provides one of its two input values at its output port. In this configuration, the multiplexers 822 provide one coefficient value for each period of the signal 4CK, four complete coefficient values during the time that one input sample value of the signal $x_{norm}(n)$ is provided.

The output ports of the multiplexers MX0 through MX21 are coupled to 22 respective eight-bit barrel shifters BS0 through BS21, collectively labeled with the reference number 824. Three of these barrel shifters, BS0, BS20 and BS21 are shown in FIG. 8. The 22 barrel shifters BS0 through BS21 are configured with a common control input port that is coupled to receive an eight-bit signal SHC provided by a sequence controller 818. The signal SHC and the other signals generated by the sequence controller 818 are discussed below in reference to FIG. 12.

In response to the signal SHC, the barrel shifters BS0 through BS31 provide their respective input values circularly shifted by between 0 and 7 bits at respective output ports. The output port of each barrel shifter has eight output terminals, each providing a corresponding bit of a respectively different coefficient value. The eight bit-values provided by each of the 22 barrel shifters are applied to eight respective multiplexers. Three of these multiplexers; the first, 826; second, 836; and eighth, 846, are shown in FIG. 8. The barrel shifters 824 are coupled to reconstruct a respectively different coefficient value at a first input port of each of the eight multiplexers 826 through 846.

The second input ports of each of the multiplexers 826 through 846 are coupled to receive the digital constant value C0 provided by a digital value source 812. The multiplexers 826 through 846 are controlled by the signal $x_{norm}(n)$ to pass the coefficient values applied to their first input ports when the signal $x_{norm}(n)$ has a value of one and to pass C0 otherwise. During one sample interval of the signal $x_{norm}(n)$, four coefficient values are applied to each of the eight multiplexers 826 through 846. The values provided by these multiplexers (either the coefficient values or C0) are applied to respective first input ports of eight multiplexed accumulators of which the first, 828; second, 838; and eighth, 848, are shown. Each of these accumulators is responsive to a signal AC, provided by the sequence controller 818, to generates four sums, one for each coefficient value, during one sample interval of the signal $x_{norm}(n)$. An exemplary structure for one of these accumulators is set forth below in reference to FIG. 10.

The operation of the accumulators in the filter circuit is described with reference to the accumulator 828. Previously accumulated values, held in registers internal to the accumulator 828, are routed from the output port of the accumulator through a gate 830 to a second input port of the accumulator 828. The gate 830 is controlled by a signal L0 to provide the value from the output port of the accumulator when the signal L0 has a value of logic-zero and to provide a value of zero when the signal L0 has a value of logic-one. When the signal L0 has a value of logic-one, a three-state gate 832 is enabled and the output value provided by the accumulator 828 is applied to an output bus, OB, which is coupled to all eight of the accumulators 828 to 848.

The other seven accumulator circuits have the same structure and operation as the accumulator 828, gate 830 and three-state gate 832. Each of the gates and three-state gates of these accumulators is controlled by a respectively different control signal, L1, L2, L3, L4, L5, L6 and L7, generated by the sequence controller 818. In response to the signals L1 through L7, sample values are applied to the bus OB in proper sequence to form the signal $y_{norm}(n)$. This signal is converted into $y(n)$ by subtracting a value, g/2, representing the DC offset in the signal $y_{norm}(n)$.

Figure 9:
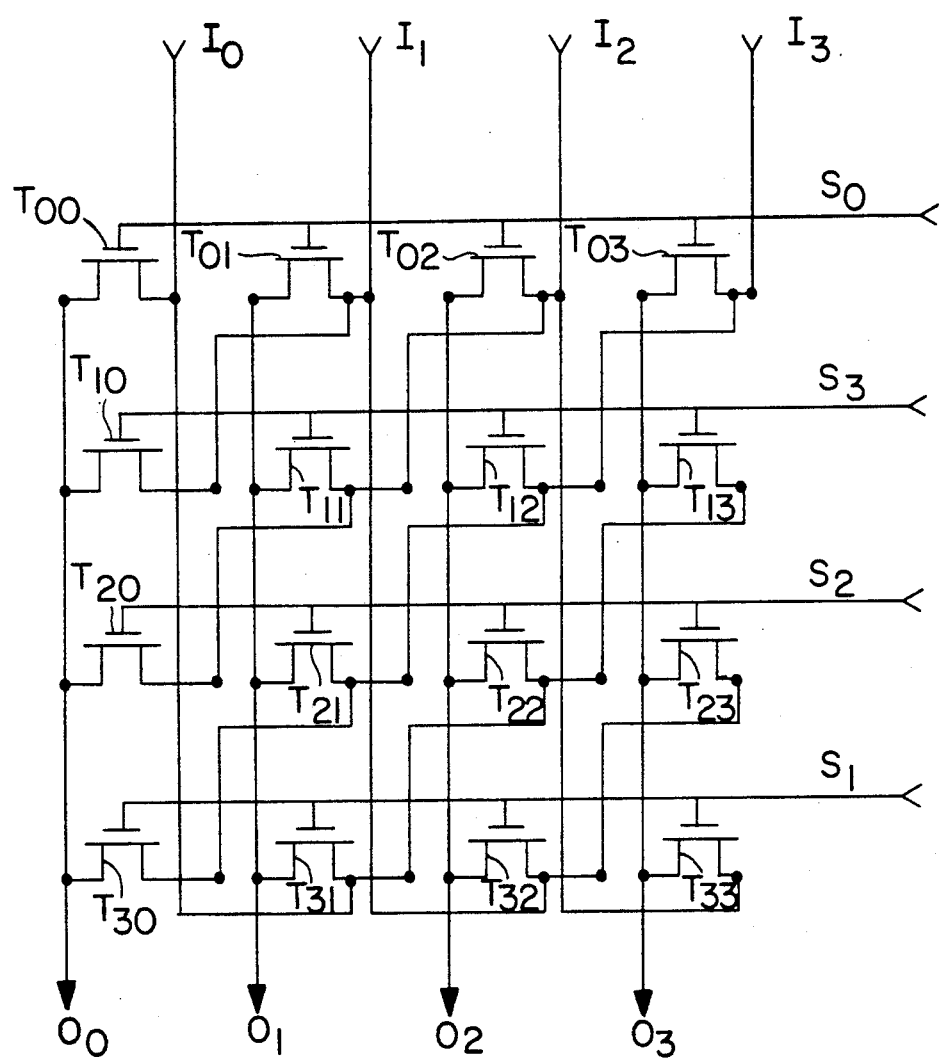
FIG. 9 is a schematic diagram of a barrel shifter suitable for use in the filter shown in FIG. 8.

FIG. 9 is a schematic diagram of a MOSFET passtransistor logic circuit which illustrates the structure and operation of the barrel shifters BS0 through BS21. For the sake of brevity, the circuitry described below is a four-bit by four-bit barrel shifter. One skilled in the art of digital logic design can readily extend this design to an eight-bit by eight-bit barrel shifter such as is used for the barrel shifters BS0 through BS21 shown in FIG. 8.

In FIG. 9, input signals are applied to four input terminals: $I_0$, $I_1$, $I_2$ and $I_3$, and output signals are available at four output terminals: $O_0$, $O_1$, $O_2$ and $O_3$. The output signals are circularly shifted by zero, one, two or three bit positions responsive to respective shift control signals: $S_0$, $S_1$, $S_2$ and $S_3$.

In response to a logic-one applied as the signal $S_0$ to the gate electrodes of transistors T00, T01, T02 and T03, the input terminals $I_0$, $I_1$, $I_2$ and $I_3$, are coupled to the output terminals $O_0$, $O_1$, $O_2$ and $O_3$. In response to a logic-one applied as the signal S1, the transistors T31, T32 and T33 couple the input terminals, $I_0$, $I_1$ and $I_2$ to the respective output terminals $O_1$, $O_2$ and $O_3$, and, the transistor T30 couples the input terminal $I_3$ to the output terminal $O_0$. The input terminal $I_3$ is coupled to the transistor T30 via the interconnected source electrodes of the transistors T03, T12, T21 and T30. The remaining shift control signals, $S_2$ and $S_3$, control the circuitry shown in FIG. 9 in the same manner as the signals $S_0$ and $S_1$ to effect circular shifts of two and three bit-positions, respectively.

Figure 10:
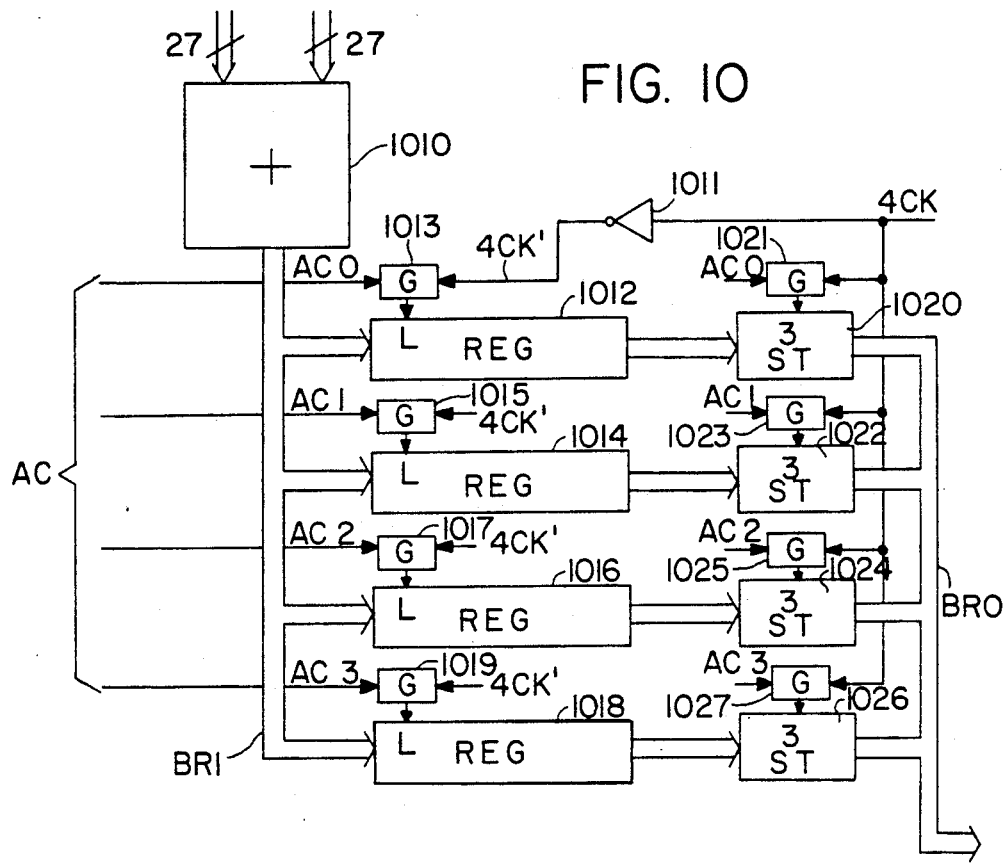
FIG. 10 is a block diagram of a time-division multiplexed accumulator suitable for use in the filter shown in FIG. 8.

Circuitry suitable for use as one of the eight multiplexed accumulators, 828 to 848 of FIG. 8, is shown in FIG. 10. The circuitry shown in FIG. 10 includes a 27-bit adder 1010 which is coupled to receive a 22-bit coefficient value at one input port and a 27-bit accumulated value from one of four accumulator registers, 1012, 1014, 1016 and 1018. The 22-bit coefficient value is padded to 27 bits by concatenating zero-valued bits at five MSB positions.

Output values generated by the adder 1010 are applied to the registers 1012, 1014, 1016 and 1018 via a common bus, BRI. One of the registers is selected to load the value provided by the adder 1010 in response to one of four control signals, AC0, AC1, AC2 and AC3. These control signals, which are collectively labeled AC, are applied to control input terminals of respective gating circuits 1013, 1015, 1017 and 1019. Each of these gating circuits is coupled to receive a signal 4CK', an inverted version of the signal 4CK provided by an inverter 1011. The registers 1012, 1014, 1016 and 1018 are conditioned to load the 27-bit values applied to their input ports coincident with a negative-going transition of the signal 4CK' passed by the respective gates 1023, 1015, 1017 and 1019 in response to the respective signals AC0, AC1, AC2 and AC3.

The contents of the registers 1012, 1014, 1016 and 1018 are gated onto a common bus BRO by respective three-state gates 1020, 1022, 1024 and 1026. These gates provide the value held by their respective registers to the bus BRO when a logic-one is applied to their enable input terminals and provide a high impedance otherwise. The enable input terminals of the three-state gates 1020, 1022, 1024, and 1026 are coupled to receive the clock signal 4CK provided by respective gating circuits 1021, 1023, 1025 and 1027 in response to the respective control signals AC0, AC1, AC2 and AC3.

In the circuitry shown in FIG. 8, the multiplexed accumulators operate as follows. Responsive to, for example, the control signal AC0, a 27-bit value from the register 1012 is applied to the bus BRO via the three state gate 1020. This value is applied to the bus during the first half of one period of the clock signal 4CK. The value on the bus BRO propagates to the second input port of the adder 1010 and is added to the coefficient or C0 value applied to the first input port of the adder. The result is stored in the register 1012 at the end of the clock period, coincident with the negative going transition of the signal 4CK'.

Only one of the signals AC0, AC1, AC2 and AC3 is active in any one period of the signal 4CK. In four consecutive periods of the signal 4CK, all four of the signals are active, conditioning the adder 1010 to perform four addition operations. The results of each of these addition operations are accumulated separately in the respective registers 1012, 1014, 1016 and 1018.

Figure 11:
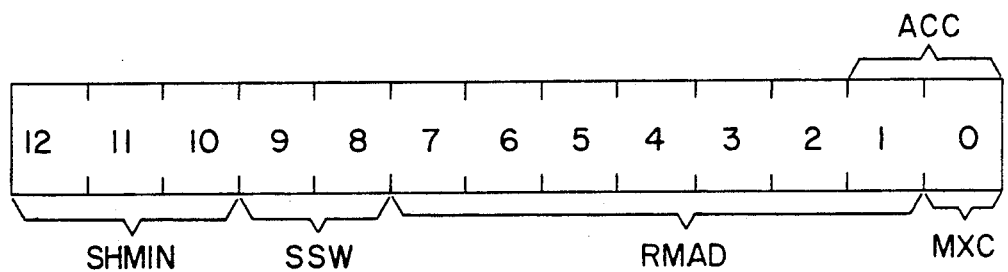
FIG. 11 is a register diagram which illustrates the mapping of various signals used in the filter shown in FIG. 8 onto the output value of a counter shown in FIG. 8.

The structure of the decimating filter shown in FIG. 8 has been described. The following is a description of the operation of the filter. To aid this explanation, it is convenient to define several sub-fields of the count value provided by the counter 810 of FIG. 8. FIG. 11 is a bit-field diagram of the output value provided by the counter 810 with several labeled sub-fields. The LSB, bit 0, of the counter value is the signal MXC which controls the multiplexers 822 of FIG. 8. The two LSB's, bits 0 and 1, of the value define a field ACC, which together with a field SSW, described below, determine the accumulator control signals AC. The signals AC control the order in which coefficient and C0 values are accumulated by the eight accumulators 828 through 848. The signals ACC and SSW are applied to the sequence controller 818 which generates the AC signals.

Bits 1-7 of the count value are the field RMAD, the address value applied to the ROM 820. The field SSW defines a one-bit shift amount which is applied to the barrel shifters 824 during a portion of a sample interval of the signal $x_{norm}(n)$. The value of the signal SSW determines the portion of the sample interval in which the one-bit shift is applied. When the signal SSW has values of one, two and three, the signal SHC is increased by one during the first clock period, the first two clock periods, and the first three clock periods, respectively, of the four clock periods of a given input sample interval. When SSW has a value of zero, the signal SHC does not change during the input sample interval. Finally, bits 10-12 of the count value define a field SHMIN which defines a minimum shift amount applied to the barrel shifters 824 during an entire sample interval of the signal $x_{norm}(n)$. Responsive to the signal SSW, a one may be added to the value held in this field during a portion of the sample interval to generate the actual shift control signal SHC.

Figure 12:
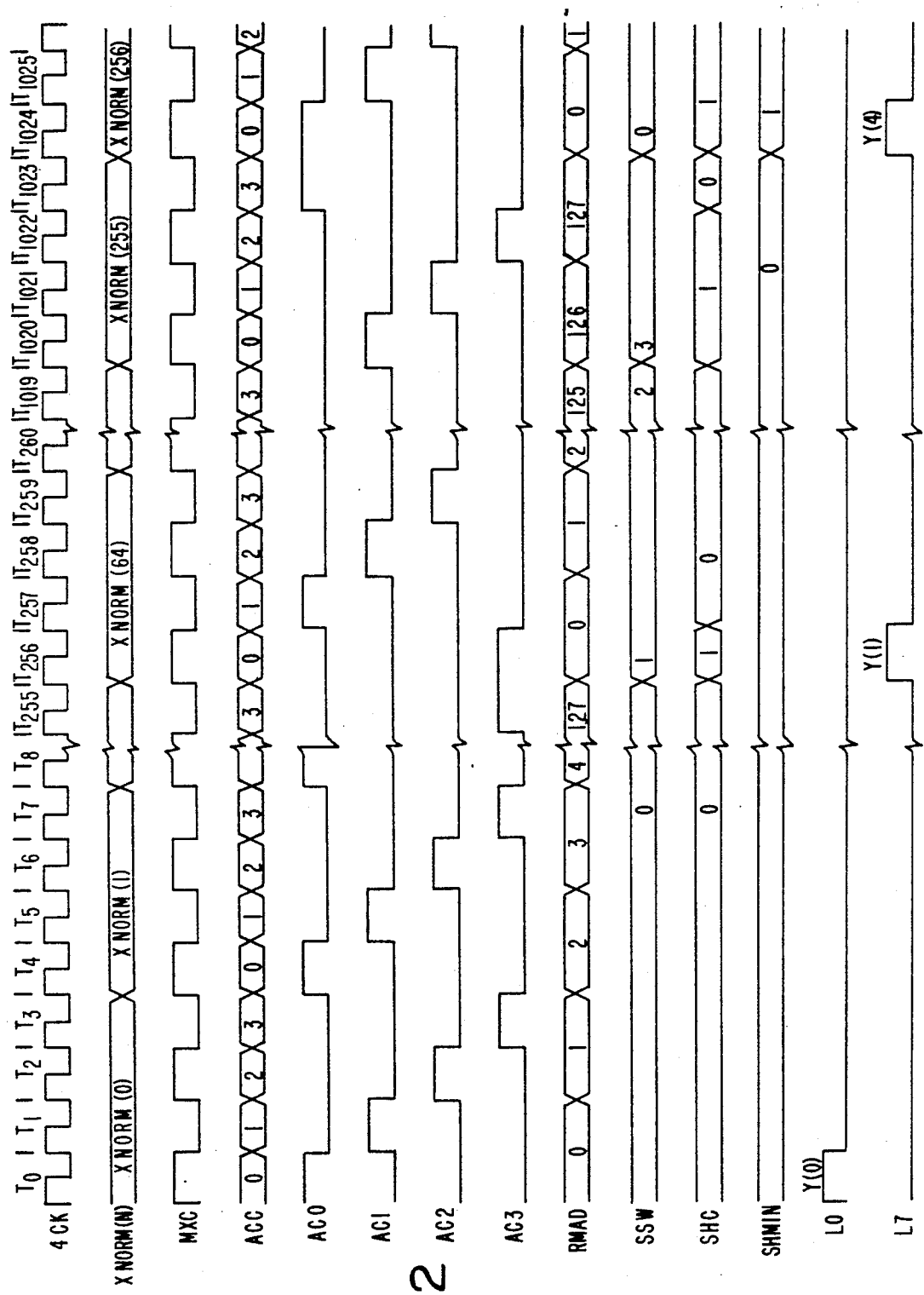
FIG. 12 is a signal timing diagram which is useful for explaining the operation of the filter shown in FIG. 8.

FIG. 12 is a timing diagram which illustrates the operation of the circuitry shown in FIGS. 8, 9 and 10 during three time intervals: $T_0-T_8$, $T_{255}-T_{260}$ and $T_{1019}-T_{1025}$. The subscripts of each of the time values used to define these intervals correspond to count values provided by the counter 810 during the time intervals.

The coefficients are arranged in ROM 820 such that 32 coefficient values are provided during each sample interval of the signal $x_{norm}(n)$ The samples in any group have index values that are separated by 64. For example, in the time interval $T_0$ through $T_3$, the 32 coefficient values $h_{norm}(0)$, $h_{norm}(64)$, $h_{norm}(128)$, ... $h_{norm}(1984)$ are provided to the eight multiplexers 826 to 846. During the time interval $T_4$ through $T_7$, the 32 coefficient values $h_{norm}(1)$, $h_{norm}(65)$, $h_{norm}(129)$, ..., $h_{norm}(1985)$ are provided to the eight multiplexers.

Four coefficient values are applied to each of the eight multiplexers 826 through 846 in time sequence, one for each period of the clock signal 4CK in the input sample interval. For example, in the first sample time interval, the coefficient values $h_{norm}(0)$, $h_{norm}(64)$, $h_{norm}(128)$ and $h_{norm}(192)$ are provided sequentially to the multiplexed accumulator 828 while the respective coefficient values $h_{norm}(256)$, $h_{norm}(320)$, $h_{norm}(384)$ and $h_{norm}(448)$ are provided to the accumulator 838. Thus, in word 0 of the ROM 820, each bit of the coefficient value $h_{norm}(0)$ is stored next to the corresponding bit of the coefficient value $h_{norm}(256)$.

In the time interval $T_0$ to $T_3$, four gated coefficient accumulations are performed in each of the eight accumulators for the input sample value $x_{norm}(0)$ for a total of 32 accumulations. The multiplexed accumulators are activated in order by the signals AC0, AC1, AC2 and AC3, tracking the values of the signal ACC. The AC signals are activated in this order when the signal SSW has a value of zero.

At time $T_0$, the signal L0 is activated to apply the value accumulated in the register 1012 of the accumulator 828 to the bus OB. One of the accumulator select signals L0 through L7 is activated whenever the ROM address signal RMAD becomes zero. The index value x of the particular signal, $L_x$, which is selected is indicated by the formula in equation (6). In equation (6), the operation "mod" represents modulo division.

$$x = (8 - SHMIN - TSSW) \bmod 8 \qquad (6)$$

where: $TSSW$ = 0 if $SSW$ = 0 and
= 1 if $SSW > 0$

In this instance, both SSW and SHMIN have values of zero. Since eight modulo eight is zero, the signal L0 is pulsed. The value provided to the output bus OB is the value currently being accumulated by the accumulator to which the select signal is applied. As set forth above, when the selected value is passed to the bus OB, a value of zero is applied to the accumulator input port. Thus, the select signals L0 through L7 operate in substantially the same manner as the phase signals $\phi_0$ through $\phi_{31}$ described above in reference to FIGS. 6 and 7.

At time $T_{256}$, the signal SSW has a value of one. This value of the signal SSW changes the order in which coefficient values are accumulated by each of the eight accumulators 828-848 and introduces a shift of one bit position during the first clock period of the time interval $T_{256}-T_{511}$. In FIG. 12, the change in the accumulator control signals is represented by the reordering of the AC signals such that AC3 occurs first followed by AC0, AC1 and AC2 in sequence. The shift of one bit-position during the first clock period of the input sample interval is represented by the shift control signal SHC having a value of one during the time interval $T_{256}$ and having a value of zero during the time interval $T_{257}-T_{259}$.

To understand why these changes occur, consider that in each pass through the ROM address space, 64 groups of 32 coefficients each are provided to the eight multiplexers 826 to 846. Thus each register in each of the multiplexed accumulators 828 to 848 sums 64 coefficient values. In the next pass through the address space of the ROM 820, each accumulator desirably sums its accumulated value with the next sequential 64 coefficient values. The accumulation performed in the first three passes through the address space of the ROM 820 is illustrated by the following table.

TABLE

| Coefficient values summed in the accumulator 828 | | | |
|---|---|---|---|
| | Pass 1 | Pass 2 | Pass 3 |
| Reg. 1012 | 0-63 | 64-127 | 128-191 |
| Reg. 1014 | 64-127 | 128-191 | 192-255 |
| Reg. 1016 | 128-191 | 192-255 | 256-319 |
| Reg. 1018 | 192-255 | 256-319 | 320-383 |

As set forth above, the order and timing of the coefficient values provided by the ROM 820 does not change in the passes through the address space of the ROM. So, the order in which the registers are activated to accumulate the coefficient values is changed from pass to pass. Thus, register 1012 is activated during the first clock period of each sample time interval in the first pass through the address space, in the second clock period of the sample time interval during the second pass through the address space, and so on. The shift of one bit-position during the first clock period of the sample time interval during the second pass through the address space replaces the coefficient values $h_{norm}(0)$ through $h_{norm}(63)$ with the adjacent coefficient values in the ROM 820, $h_{norm}(256)$ through $h_{norm}(319)$. Since the order of accumulation has been changed, these coefficient values are applied to the fourth register, 1018, of the accumulator 828.

Referring again to FIG. 12, the select line L7 is activated when the signal RMAD becomes zero. This occurs when the register 1018 of the accumulator 848 is being read. Consequently, the value in that register is applied to the output bus OB while a value of zero is applied to the input port of the accumulator. In this instance, the signal SHC has a value of one because the signal SSW is non-zero. According to equation (6) the select signal L7 is activated to provide an output value on the bus OB.

The last time interval shown in FIG. 12 illustrates the transition to a non-zero value for the signal SHMIN. In the time interval $T_{1020}$, the signal SSW has a value of three, indicating that the signal SHC is to be incremented by one during the first three clock periods, $T_{1020}$ to $T_{1023}$, of the input sample interval. This value of the signal SSW also changes the order of accumulation such that AC1 occurs first followed, in sequence, by AC2, AC3 and AC0.

In the time interval $T_{1024}$ the signal SHMIN becomes one and the signal SSW becomes 0. The signal SHC has a value of one, consequently, the select signal L7 is activated when the signal RMAD becomes zero. This select signal conditions the accumulator 848 to apply the contents of the register 1012 to the output bus OB and apply a zero value to the input port of the accumulator to begin the next coefficient accumulation cycle for the register. In the time interval $T_{1024}$–$T_{1027}$, the coefficient values $h_{norm}(256)$, $h_{norm}(320)$, $h_{norm}(384)$ and $h_{norm}(448)$ are applied to the multiplexer 826. These coefficient values were applied to the multiplexer 836 during the time interval $T_0T_3$.

The operation of the decimating filter continues in the manner outlined above. When, at $T_{8192}$, the counter value overflows from 8192 to 0, the timing diagram begins again at $T_0$.

While the invention has been described in terms of three exemplary embodiments, it is contemplated that it may be practiced as outlined above with modifications within the spirit and scope of the appended claims.

We claim:

1. A filtering system for processing a sampled data input signal, comprising:
    memory means for holding Q coefficient values representing a single impulse response and for providing N of said coefficient values at a plurality of output ports, where Q and N are integers;
    a plurality of processing means, including gating means and an accumulator, for combining said input signal with P of said N coefficient values to generate R filtered output signals, where P and R are integers;
    means for combining said R filtered output signals to generate a single filtered output signal;
    distributing means, including a barrel shifter, coupled to said memory means and responsive to a control signal for distributing P of said N coefficient values to said plurality of processing means in a correspondence determined by said control signal; and
    control means coupled to said distributing means for generating said control signal to change the correspondence between said P coefficient values and said plurality of processing means.

2. The filtering system set forth in claim 1 wherein:
    said input signal is a single-bit digital signal;
    said Q coefficient values are each M-bit digital values where M is an integer;
    said plurality of processing means includes a respective plurality of L-bit digital accumulators where L is an integer greater than M; and
    said plurality of digital accumulators are responsive to said input signal to selectively accumulate the P coefficient values provided by said distributing means.

3. The filtering system set forth in claim 2 wherein:
    said memory means has K output ports each configured to provide a respectively different portion of each of said N coefficient values, where K is an integer; and
    said coefficient distributing means includes K bit-shifting means, each having an input port coupled to a respectively different one of the K output ports of said memory means and an output port coupled to each of said plurality of processing means.

4. The filtering system set forth in claim 3 wherein each of the K output ports of said memory means provides values representing, respectively, one corresponding bit-position value of N of said Q coefficient values.

5. The filling system set forth in claim 2 wherein each of said plurality of accumulators is a time-division multiplexed accumulation.

6. A filtering system for processing a single-bit digital sampled data input signal to produce a multi-bit digital sampled data output signal, comprising:
    memory means for holding Q coefficient values, each of said coefficient values being normalized to be non-negative by addition of a non-zero positive offset value;
    a source of null coefficient, having a value substantially equal to said non-zero positive offset value, representing a zero coefficient value; and
    accumulating means, coupled to said memory means and responsive to said sampled data input signal having first or second values for selectively adding, respectively, said null coefficient value or one of the coefficient values held by said memory means to an accumulated sum to generate multi-bit sample values representing said output signal.

7. The filtering system set forth in claim 6 wherein:
    said accumulating means are L-bit digital accumulators where L is an integer; and
    said null coefficient value is selected such that the accumulation of said null coefficient value O times is a I-bit value having zeros in the L least significant bit positions, where I is an integer greater than L.

* * * * *